US007932536B2

(12) United States Patent
Hamerski et al.

(10) Patent No.: US 7,932,536 B2
(45) Date of Patent: Apr. 26, 2011

(54) POWER RECTIFIERS AND METHOD OF MAKING SAME

(75) Inventors: Roman Jan Hamerski, Overland Park, KS (US); Jonathan Moult, Lee's Summit, MO (US); Timothy S. Eastman, Lee's Summit, MO (US)

(73) Assignee: Diodes Incorporated, Dallas, TX (US)

( * ) Notice: Subject to any disclaimer, the term of this patent is extended or adjusted under 35 U.S.C. 154(b) by 232 days.

(21) Appl. No.: 12/208,215

(22) Filed: Sep. 10, 2008

(65) Prior Publication Data
US 2009/0039384 A1    Feb. 12, 2009

Related U.S. Application Data

(63) Continuation-in-part of application No. 11/684,261, filed on Mar. 9, 2007, now Pat. No. 7,847,315.

(60) Provisional application No. 60/971,309, filed on Sep. 11, 2007.

(51) Int. Cl.
*H01L 29/88* (2006.01)
*H01L 21/329* (2006.01)

(52) U.S. Cl. .................................................. 257/104

(58) Field of Classification Search ............... 438/270, 438/197, 268, 502, 509, 660–664, 530, 540; 257/334, E27.091, E29.166, E29.226, E29.255–E29.257, 257/214, 216, 302, 328, 331, E21.262, E21.41, 257/E29.012, E29.013, E27.052, E27.079, 257/E29.036–E29.038, E29.046–E29.048, 257/E29.115, E29.196, E29.211–E29.225, 257/E21.077, E21.082, E21.333, E21.12, 257/E21.324, E21.454, E21.497, E33.075, 257/109, 155–156
See application file for complete search history.

(56) References Cited

U.S. PATENT DOCUMENTS

| 4,682,405 | A | 7/1987 | Blanchard et al. | |
|---|---|---|---|---|
| 4,767,722 | A | 8/1988 | Blanchard et al. | |
| 4,798,810 | A | 1/1989 | Blanchard et al. | |
| 4,824,795 | A | 4/1989 | Blanchard et al. | |
| 4,827,324 | A | 5/1989 | Blanchard et al. | |
| 4,835,586 | A | 5/1989 | Cogan et al. | |
| 4,845,051 | A | 7/1989 | Cogan et al. | |
| 5,034,785 | A | 7/1991 | Blanchard et al. | |
| 5,164,325 | A | 11/1992 | Cogan et al. | |
| 7,186,609 | B2* | 3/2007 | Korec et al. | 438/221 |
| 7,250,343 | B2* | 7/2007 | Kotek et al. | 438/270 |
| 2004/0253789 | A1* | 12/2004 | Haase | 438/270 |
| 2005/0151221 | A1* | 7/2005 | Ohtani | 257/500 |
| 2005/0170587 | A1* | 8/2005 | Izumisawa et al. | 438/270 |
| 2005/0272262 | A1* | 12/2005 | Kim | 438/682 |
| 2007/0194374 | A1* | 8/2007 | Bhalla et al. | 257/330 |

(Continued)

*Primary Examiner* — Dao H Nguyen
*Assistant Examiner* — Tram H Nguyen
(74) *Attorney, Agent, or Firm* — Chad R Walsh; Fountainhead Law Group P.C.

(57) ABSTRACT

In one embodiment the present invention includes a semiconductor rectifier device comprising a first, second, and third semiconductor regions and a gate. The first semiconductor region is of a first conductivity type. The second semiconductor region is adjacent to the first semiconductor region which has a second conductivity type. The third semiconductor region is adjacent to the second semiconductor region which has the second conductivity type. The gate is proximate to but insulated from the second semiconductor region and electrically coupled to the third semiconductor region. When the first semiconductor region is biased in a first direction, an inversion region forms in the second semiconductor region. The inversion region forms a forward-biased tunnel diode junction with the third semiconductor region. When the first semiconductor region is biased a second direction, the semiconductor rectifier device functions as a reverse-biased PIN diode.

20 Claims, 15 Drawing Sheets (detail A)

U.S. PATENT DOCUMENTS

| | | | |
|---|---|---|---|
| 2007/0210401 A1* | 9/2007 | Sanfilippo et al. | 257/471 |
| 2008/0035989 A1* | 2/2008 | Jaw et al. | 257/330 |
| 2008/0087896 A1* | 4/2008 | Chiola | 257/73 |
| 2008/0138953 A1* | 6/2008 | Challa et al. | 438/270 |
| 2008/0197407 A1* | 8/2008 | Challa et al. | 257/330 |
| 2008/0199997 A1* | 8/2008 | Grebs et al. | 438/270 |
| 2009/0166731 A1* | 7/2009 | Maruoka | 257/330 |
| 2009/0305475 A1* | 12/2009 | Hshieh | 438/237 |
| 2010/0013009 A1* | 1/2010 | Pan | 257/330 |
| 2010/0258866 A1* | 10/2010 | Pan | 257/330 |

* cited by examiner (detail A)

(detail A)

(detail A)

(detail A)

(detail A)

(detail A)

(detail A)

(detail A)

(detail A)

(detail A)

(detail A)

POWER RECTIFIERS AND METHOD OF MAKING SAME

CROSS REFERENCE TO RELATED APPLICATIONS

This application is a non-provisional of and claims the benefit of priority from U.S. patent application Ser. No. 60/971,309, filed Sep. 11, 2007, entitled "POWER RECTIFIER AND METHOD OF MAKING SAME" the disclosure of which is hereby incorporated herein by reference. This application is also a continuation-in-part of U.S. patent application Ser. No. 11/684,261, filed on Mar. 9, 2007, the disclosure of which is hereby incorporated herein by reference.

BACKGROUND

The present invention relates to a rectifiers, and in particular, to power rectifiers and methods of making same.

Unless otherwise indicated herein, the approaches described in this section are not prior art to the claims in this application and are not admitted to be prior art by inclusion in this section.

Power electronics is associated with the efficient conversion, control and conditioning of electric power. This may include rectifying alternating current (AC) and converting this form of electrical power to direct current (DC). Diodes have been utilized as power rectifiers for many years and have been instrumental in providing power conversion for many of the systems which connect to the common AC power provided in most businesses and homes.

Power rectifiers have been fabricated utilizing semiconductor doping. Some diodes (i.e. rectifiers) are fabricated with the N-type and P-type dopants such as phosphorus and boron, respectively. The region between these types of material forms a P-N junction which intrinsically has a contact potential. In order for the diode to pass current, a nominal biasing voltage needs to overcome the contact potential at the junction. This bias voltage is typically about 600 mV.

For historical power electronics utilizing 12 V and 5 V power supplies and having currents less than 1 A, this voltage drop of 600 mV has not been a problem. However, today's electronic devices may utilize 1.8 V power supplies to power a device. Additionally when high power systems have several amperes of current passing through the rectifiers, the 600 mV drop may result in a significant power loss. This power dissipation may also translate into heat dissipation and temperature concerns for the device.

Thus, there is a need for improved rectifiers. The present invention solves these and other problems by providing power rectifiers and methods for making same.

SUMMARY

Embodiments of the present invention improve power rectifiers and methods for making same. In one embodiment the present invention includes a semiconductor rectifier device comprising a first, second, and third semiconductor region and a gate. The first semiconductor region is of a first conductivity type and has a first dopant concentration. The second semiconductor region is adjacent the first semiconductor region. The second semiconductor region is of a second conductivity type and has a second dopant concentration. The third semiconductor region is adjacent to the second semiconductor region. The third semiconductor region is of the second conductivity type and has a third dopant concentration greater than the second dopant concentration. The gate is proximate to but insulated from the second semiconductor region and electrically coupled to the third semiconductor region. When the first semiconductor region is biased with respect to the gate and third semiconductor region in a first direction, an inversion region of the first conductivity type forms in the second semiconductor region extending from the first semiconductor region to the third semiconductor region. The inversion region forms a forward-biased tunnel diode junction with the third semiconductor region. When the first semiconductor region is biased with respect to the gate and third semiconductor region in a second direction opposite the first direction, the inversion region does not form, and the semiconductor rectifier device functions as a reverse-biased diode In another embodiment, when the first semiconductor region is biased with respect to the gate and third semiconductor region in the second direction, the device functions as a PIN diode.

In another embodiment, the first semiconductor region comprises an epitaxial layer formed on a substrate of the first conductivity type. The second semiconductor region comprises a layer on the first semiconductor region. The third semiconductor region comprises a layer on the second semiconductor region. The trench extends through the second and third semiconductor regions and at least part of the first semiconductor region. Gate insulation is formed on the walls of the trench. The gate is formed in the trench adjacent the gate insulation.

In another embodiment, when the first semiconductor region is biased with respect to the gate and the third semiconductor region in the second direction, the semiconductor device functions as a reverse-biased PIN diode.

In another embodiment, the present invention includes a semiconductor rectifier device comprising a first, second, and third semiconductor regions and a gate. The first semiconductor region is of a first conductivity type and has a first dopant concentration. The second semiconductor region is adjacent to the first semiconductor region that has a second conductivity type and a second dopant concentration. A third semiconductor region is adjacent to the second semiconductor region that has the second conductivity type and a third dopant concentration greater than the second dopant concentration. A gate is proximate to but insulated from the second semiconductor region and electrically coupled to the third semiconductor region. When the first semiconductor region is biased with respect to the gate and third semiconductor region in a first direction, an inversion region of the first conductivity type forms in the second semiconductor region extending from the first semiconductor region to the third semiconductor region. The inversion region forms a PN junction with the third semiconductor region. When the first semiconductor region is biased with respect to the gate and third semiconductor region in a second direction opposite the first direction, the inversion region does not form, and the semiconductor rectifier device functions as a reverse-biased PIN diode.

In another embodiment, In another embodiment, the present invention includes a method for operating a semiconductor device. The semiconductor device comprises a first, second, and third semiconductor region. The first semiconductor region is of a first conductivity type and has a first dopant concentration. The second semiconductor region is adjacent to the first semiconductor region that has a second conductivity type and a second dopant concentration. The third semiconductor region is adjacent to the second semiconductor region and has a third dopant concentration greater than the second dopant concentration. The gate is proximate to but insulated from the semiconductor region. The gate is electrically coupled to the third semiconductor region. The method comprises applying a voltage in a first and second direction. The applying of the voltage in a first direction to the third semiconductor region and the gate relative to the first semiconductor region to thereby form an inversion region of the first conductivity type within the second semiconductor region. Accordingly this forms a forward-biased tunnel diode junction between the third semiconductor region and the inversion region. The applying of the voltage in a second direction to the third semiconductor region and the gate relative to the first semiconductor region to thereby cause the device to function as a reverse-biased diode.

In another embodiment, the present invention includes a method for operating a semiconductor device The semiconductor device comprises a first, second, and third semiconductor region. The first semiconductor region is of a first conductivity type and has a first dopant concentration. The second semiconductor region is adjacent to the first semiconductor region that has a second conductivity type and a second dopant concentration. The third semiconductor region is adjacent to the second semiconductor region and has a third dopant concentration greater than the second dopant concentration. The gate is proximate to but insulated from the semiconductor region. The gate is electrically coupled to the third semiconductor region. The method comprises applying a voltage in a first and second direction. The applying of the voltage in the first direction includes applying the voltage in the first direction to the third semiconductor region and the gate relative to the first semiconductor region. Accordingly this form an inversion region of the first conductivity type within the second semiconductor region. This forms a forward-biased PN junction between the third semiconductor region and the inversion region. The applying of the voltage in the second direction includes applying the voltage in the second direction to the third semiconductor region and the gate relative to the first semiconductor region. Accordingly, this causes the device to function as a reverse-biased PIN diode.

In another embodiment, the present invention includes a method for making a semiconductor device. The method comprises providing a first, second, and third semiconductor region and providing a gate. The providing the first semiconductor region includes providing the first semiconductor region of a first conductivity type and a first dopant concentration. The providing the second semiconductor region includes providing a second semiconductor region adjacent the first semiconductor region that has a second conductivity type and a second dopant concentration. The providing the third semiconductor region includes providing a third semiconductor region adjacent the second semiconductor region that has the second conductivity type and a third dopant concentration greater than the second dopant concentration. The providing the gate includes providing a gate which is proximate to but insulated from the second semiconductor region. The gate is also electrically coupled to the third semiconductor region. When the first semiconductor region is biased with respect to the gate and third semiconductor region in a first direction, an inversion region of the first conductivity type forms in the second semiconductor region extending from the first semiconductor region to the third semiconductor region. The inversion region forms a forward-biased tunnel diode junction with the third semiconductor region, and when the first semiconductor region is biased with respect to the gate and third semiconductor region in a second direction opposite the first direction, the inversion region does not form, and the semiconductor rectifier device functions as a reverse-biased diode.

In another embodiment, the present invention includes a method for making a semiconductor device comprises providing a first, second, and third semiconductor regions. The method comprises providing a first, second, and third semiconductor region and providing a gate. The providing the first semiconductor region includes providing the first semiconductor region of a first conductivity type and a first dopant concentration. The providing the second semiconductor region includes providing a second semiconductor region adjacent the first semiconductor region that has a second conductivity type and a second dopant concentration. The providing the third semiconductor region includes providing a third semiconductor region adjacent the second semiconductor region that has the second conductivity type and a third dopant concentration greater than the second dopant concentration. The providing the gate includes providing a gate which is proximate to but insulated from the second semiconductor region. The gate is also electrically coupled to the third semiconductor region. When the first semiconductor region is biased with respect to the gate and third semiconductor region in a first direction, an inversion region of the first conductivity type forms in the second semiconductor region extending from the first semiconductor region to the third semiconductor region. The inversion region forms a forward-biased diode junction with the third semiconductor region. When the first semiconductor region is biased with respect to the gate and third semiconductor region in a second direction opposite the first direction, the inversion region does not form, and the semiconductor rectifier device functions as a reverse-biased PIN diode.

In another embodiment, the present invention includes a method comprising providing a semiconductor device and applying a first and second electrical potentials. The semiconductor device comprises a first, second, and third semiconductor regions and a gate. The first semiconductor region is of a first conductivity type and has a first dopant concentration. Adjacent to the first semiconductor devices is a second semiconductor region of a second conductivity type and a second dopant concentration. The third semiconductor region of the second conductivity type has third dopant concentration greater than the second dopant concentration, and a gate electrically insulated from the second semiconductor region. The applying of the first electrical potentials includes applying the first electrical potential to the gate to form an inversion region of the first conductivity type so that a first PN junction exists between the inversion region and the third semiconductor region and the device functions as a diode using the first PN junction. The applying of the second electrical potential includes applying a second electrical potential to the gate so that the inversion region does not form, and the device functions as a diode using a second PN junction between the first and second regions.

In another embodiment, the present invention includes a method of manufacturing a semiconductor rectifier device. The method comprises depositing an N-drift region, implanting boron, forming a plurality of trenches, forming a dielectric layer, depositing conductive material, etching back, depositing a layer of titanium, and annealing. The depositing the N-drift region includes depositing an N-drift region on an N++ substrate. The implanting of boron includes implanting boron into the N-drift region to create a P-body layer. The forming of the plurality of trenches includes forming a plurality of trenches within the P-body layer. The trenches form a plurality of P-body regions. The forming the dielectric layer includes forming the dielectric layer within each trench of the plurality of trenches. The depositing conductive material includes depositing conductive gate material to fill a remaining volume within each trench of the plurality of trenches. The etching back includes etching back the conductive gate material to form a planar surface above the plurality of P-body regions. The depositing the layer of titanium includes depositing a layer of titanium and a layer of titanium nitride on the planar surface. The annealing includes annealing to create a layer of titanium silicide at an interface between the plurality of P-body regions and the titanium layer, and in accordance therewith, forming a δp++ layer.

In another embodiment, the annealing has a peak temperature of 710 degrees Celsius and an annealing time from 15 seconds to 75 seconds.

In another embodiment, the annealing has an annealing time from 15 seconds to 75 seconds.

In another embodiment, the forming the dielectric layer includes growing a gate oxide between 20 Angstroms and 200 Angstroms.

In another embodiment, the conductive gate material is a polysilicon doped with phosphorous using a LPCVD system In another embodiment, the forming the plurality of trenches includes performing lithography to define the trenches, and etching the trenches to a depth between 0.3 μm to 2.0 μm.

In another embodiment, depositing the N-drift region on the N++ substrate includes epitaxially depositing to create the N-drift region. The N++ substrate is an arsenic-doped or phosphorus-doped single crystal silicon substrate having a resistivity lower than 0.005 Ωcm In another embodiment, the N-drift region has a resistivity of approximately 0.4 Ω cm and a thickness of approximately 4 μm.

In another embodiment, the invention further comprising growing, etching, implanting, activating, and removing. The growing includes growing a oxide within the trench prior to forming the dielectric layer. The etching includes etching the oxide which leaves a bottom of the trenches of the plurality of trenches free of silicon dioxide. The implanting includes implanting boron at the bottom of the trenches of the plurality of trenches. The activation includes activating the boron at the bottom of the trenches of the plurality of trenches. The removing includes removing the oxide.

In another embodiment, the activating the boron at the bottom of the trenches of the plurality of trenches includes using rapid thermal annealing at approximately 1000 degrees Celsius for a time between 15 to 60 seconds.

In another embodiment, the present invention includes a semiconductor rectifier device comprising an anode terminal, a a δp++ layer, a P-body region, an N-drift region, an N++ substrate, a cathode terminal, a dielectric layer, and a conductive layer. The δp++ layer is electrically coupled to the anode terminal. The P-body region is located adjacent to the δp++ layer. The N-drift region is located adjacent to the P-body region. The N++ substrate is located adjacent to the N-drift region. The cathode terminal is electrically coupled to the N++ substrate. A dielectric layer is perpendicular to the δp++ layer and adjacent to the P-body region. The conductive layer is adjacent and parallel to the dielectric layer. The conductive layer is electrically coupled to the anode terminal. If a forward bias of the semiconductor rectifier device is provided across the anode and cathode terminals. The P-body region inverts and becomes an n-type conductive channel. Accordingly, an interface of a portion of the δp++ layer and the n-type conductive channel form a tunnel diode.

In another embodiment, the P-body region has a low doping concentration such that the P-body region may be inverted with the forward bias being near 0 volts, and in accordance therewith, improve the efficiency of the rectifier.

In another embodiment, the δp++ layer does not have a width beyond several atomic layers such that the doping concentration of the layer does not have a significant length parallel along the dielectric and conductive layers. Accordingly, the δp++ layer does not significantly inhibit the inversion of the P-body region when the forward bias is provided.

In another embodiment, if a reverse bias of the semiconductor rectifier device is provided to the anode and cathode terminals, the P-body, N-drift region, and the N++ substrate form a PIN diode such that a reverse leakage current is reduced.

In another embodiment, the semiconductor rectifier device further comprises a second P-body region adjacent to the δp++ layer. The dielectric layer and the conductive layer are formed within a trench and the P-body region is located adjacent to a first side of the trench and the second P-body region is located on a second side of the trench. The dielectric layer forms a first layer within the trench and the conductive layer fills in a remaining volume of the trench. The trench protrudes within the N-drift region. If the forward bias is provided to the anode and cathode terminals, the second P-body region inverts and becomes a second n-type conductive channel. Accordingly, an interface of a second portion of the δp++ layer and the n-type conductive channel form a second tunnel diode.

In another embodiment, the semiconductor rectifier device further comprising a P-implanted region at a bottom of the trench. The P-implanted region lies between the dielectric layer and the N-drift area, the conductive layer having corners at the bottom of the trench. The P-conductive area reduces high electric field intensity at the corners of the trench.

In another embodiment, the present invention includes a semiconductor rectifier device. The semiconductor rectifier device comprising an anode terminal, a a δp++ layer, a plurality of P-body regions, an N-drift region, a plurality of trenches, an N++ substrate, a cathode terminal. The δp++ layer is electrically coupled to the anode terminal. The plurality of P-body regions are each located adjacent to a portion of the δp++ layer. The N-drift region is located adjacent to the plurality of P-body regions. The plurality of trenches has sides adjacent to the P-body regions and has a bottom protruding within the n-drift region. Each trench comprises a dielectric layer and a conductive layer. The dielectric layer forms a first layer covering the sides and bottom of the trench. The conductive layer fills a remaining volume within the trench. The N++ substrate located adjacent to the N-drift region. The cathode terminal is electrically coupled to the N++ substrate. If a forward bias of the semiconductor rectifier device is provided across the anode and cathode terminals, each side of the P-body region of the plurality of P-body regions inverts and becomes an n-type conductive channel. Accordingly a plurality of interfaces between a plurality of portions of the δp++ layer and their corresponding n-type conductive channels form a plurality of tunnel diodes.

In another embodiment, the plurality of P-body regions each have a low doping concentration such that each P-body region may be inverted with the forward bias being near 0 volts, and in accordance therewith, improve the efficiency of the rectifier.

In another embodiment, the δp++ layer does not have a width beyond several atomic layers such that the doping concentration of the layer does not have a significant length parallel along the dielectric and conductive layers within the plurality of trenches, and in accordance therewith, the δp++ layer does not significantly inhibit the inversion of the plurality of P-body regions when the forward bias is provided.

In another embodiment, if a reverse bias of the semiconductor rectifier device is provided to the anode and cathode terminals, the plurality of P-body, the N-drift region, and the N++ substrate form a PIN diode such that the reverse leakage current is reduced.

The following detailed description and accompanying drawings provide a better understanding of the nature and advantages of the present invention.

BRIEF DESCRIPTION OF THE DRAWINGS

The present invention is described herein with reference to the following figures, which are not to scale.

DETAILED DESCRIPTION

Described herein are techniques for power rectifiers and method of making same. In the following description, for purposes of explanation, examples and specific details are set forth in order to provide a thorough understanding of the present invention. It will be evident, however, to one skilled in the art that the present invention as defined by the claims may include some or all of the features in these examples alone or in combination with other features described below, and may further include modifications and variations of the features and concepts described herein.

Figure 1:
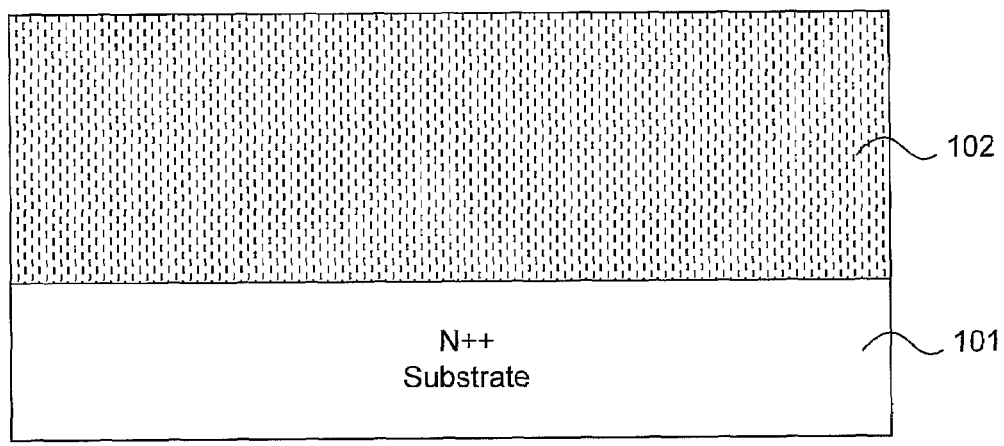
FIG. 1 illustrates a sectional view of a portion of a semiconductor wafer following a first step according to one embodiment of the present invention.

Step 1: (Referring to FIG. 1) Epitaxially depositing on arsenic-doped or phosphorus-doped single crystal silicon substrate 101. The silicon substrate 101 may have a resistivity lower than approximately 0.005 Ωcm. The epitaxial layer 102 may have a resistivity of approximately 0.4 Ωcm and a thickness of approximately 4 µm for diode with breakdown voltage greater than 30 V. For diodes designed for higher blocking voltage capability values of resistivity and epi thickness will be significantly higher. The epitaxial layer 102, in this embodiment, is the N-drift layer.

Figure 2:
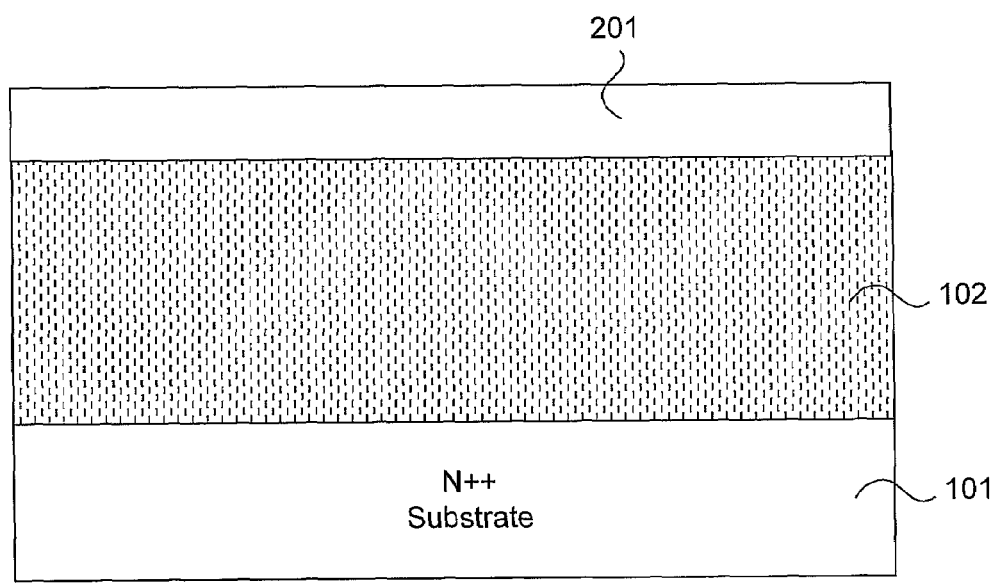
FIG. 2 illustrates a sectional view of a portion of a semiconductor wafer following a second step according to one embodiment of the present invention.

Step 2: (Referring to FIG. 2) Growing an initial silicon oxide layer 201 to a thickness between approximately 0.2 µm and 1.2 µm, and typically approximately 0.75 µm.

Figure 3:
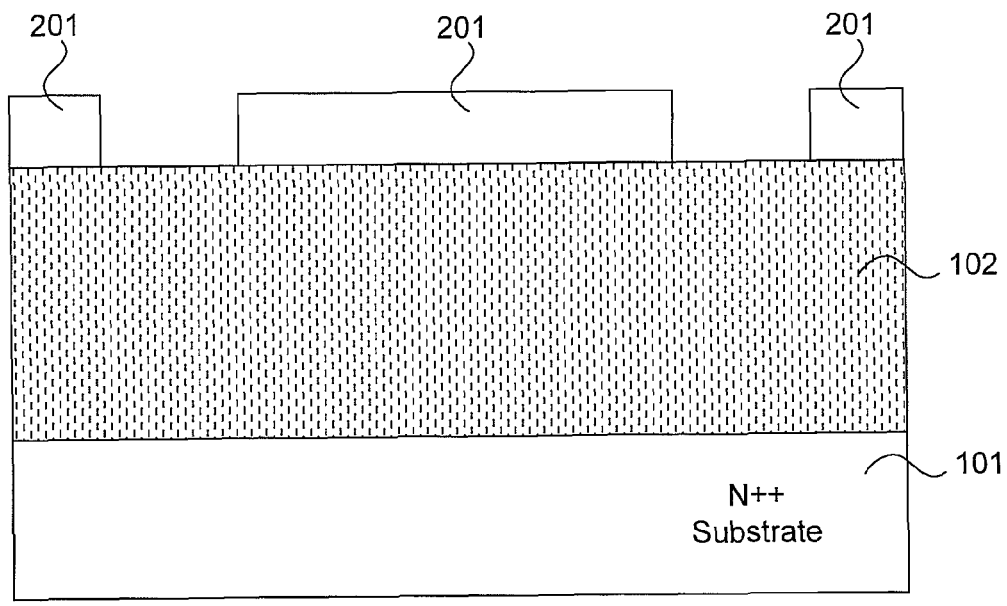
FIG. 3 illustrates a sectional view of a portion of a semiconductor wafer following a third step according to one embodiment of the present invention.

Step 3: (Referring to FIG. 3) Performing a first photolithography step (referred to as "GUARD RING") to define a guard ring, including etching the silicon oxide 201 and stripping the photoresist.

Step 4: Implanting the guard ring with boron. The dose may be approximately $3\times10^{13}$ and the energy may be approximately 30 keV. However, the range of dose and energy may be very wide.

Figure 4:
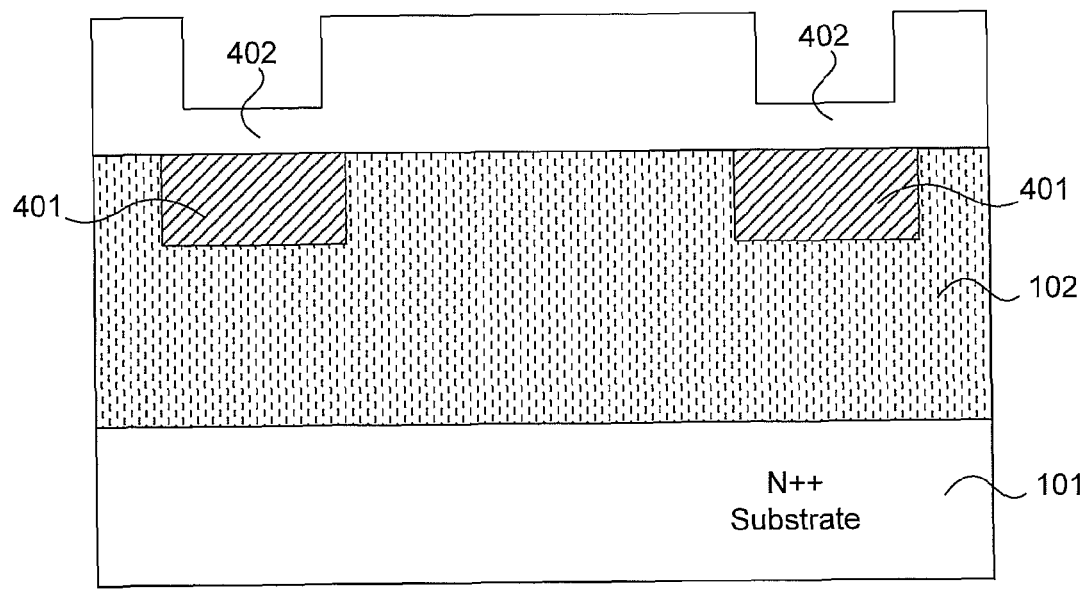
FIG. 4 illustrates a sectional view of a portion of a semiconductor wafer following a fifth step according to one embodiment of the present invention.

Step 5: (Referring to FIG. 4) Diffusing the implanted boron 401 and re-growing a thin oxide layer 402 over the boron-implanted silicon 401 to provide effective edge termination.

For devices having a relatively low breakdown voltage, e.g., approximately equal to or less than 40 V, steps 3, 4, and 5 may be eliminated.

Figure 5:
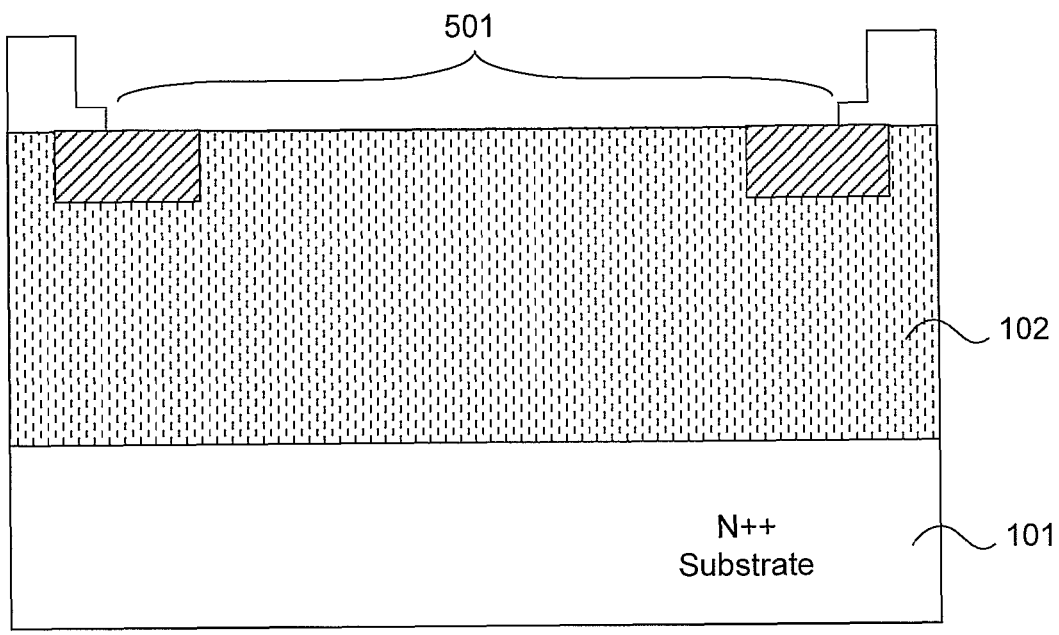
FIG. 5 illustrates a sectional view of a portion of a semiconductor wafer following a sixth step according to one embodiment of the present invention.

Step 6: (Referring to FIG. 5) Performing a second photolithography step (referred to as "ACTIVE PHOTO") to open an active area by etching the $SiO_2$ in the center of the chip 501.

Figure 6:
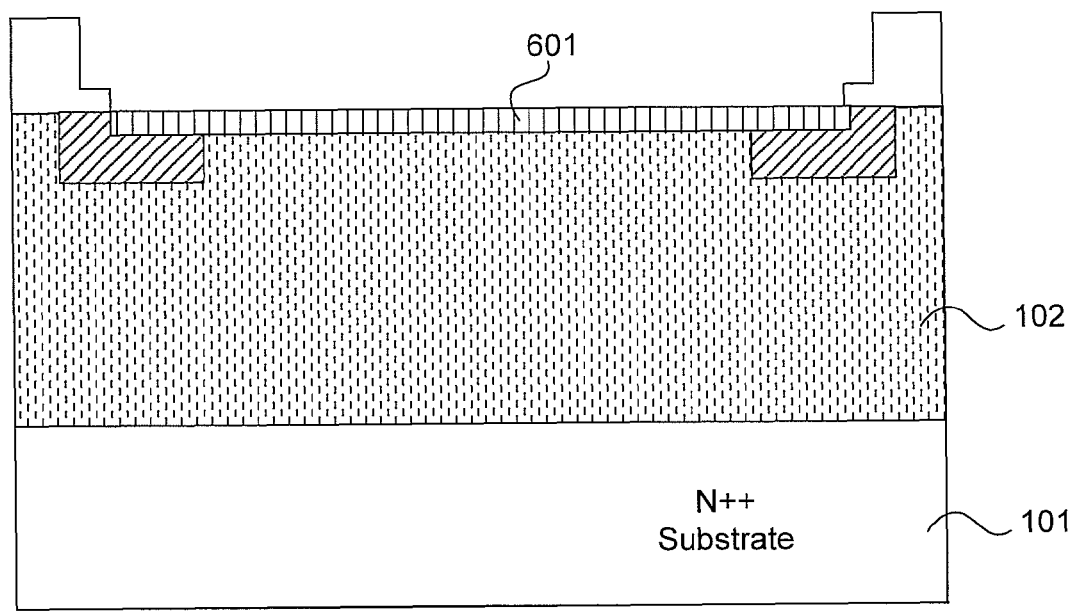
FIG. 6 illustrates a sectional view of a portion of a semiconductor wafer following a seventh step according to one embodiment of the present invention.

Step 7: (Referring to FIG. 6) Implanting a shallow layer of boron 601.

Figure 7:
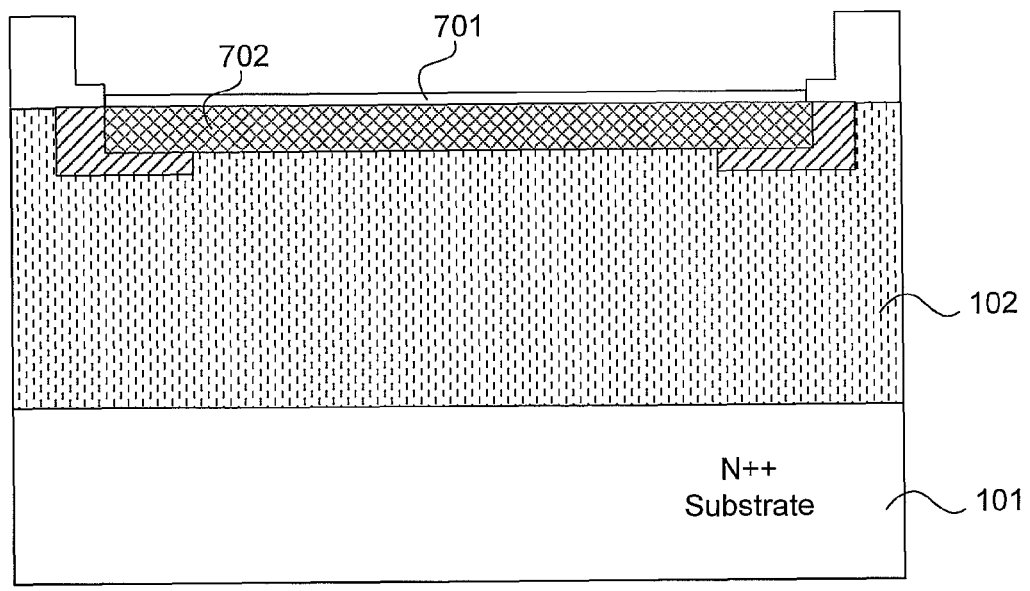
FIG. 7 illustrates a sectional view of a portion of a semiconductor wafer following an eighth step according to one embodiment of the present invention.

Step 8: (Referring to FIG. 7) Activating the boron 601 with low temperature diffusion, and growing a thin layer of protective oxide 701. The activating of boron 601 creates P-body layer 702.

Figure 8:
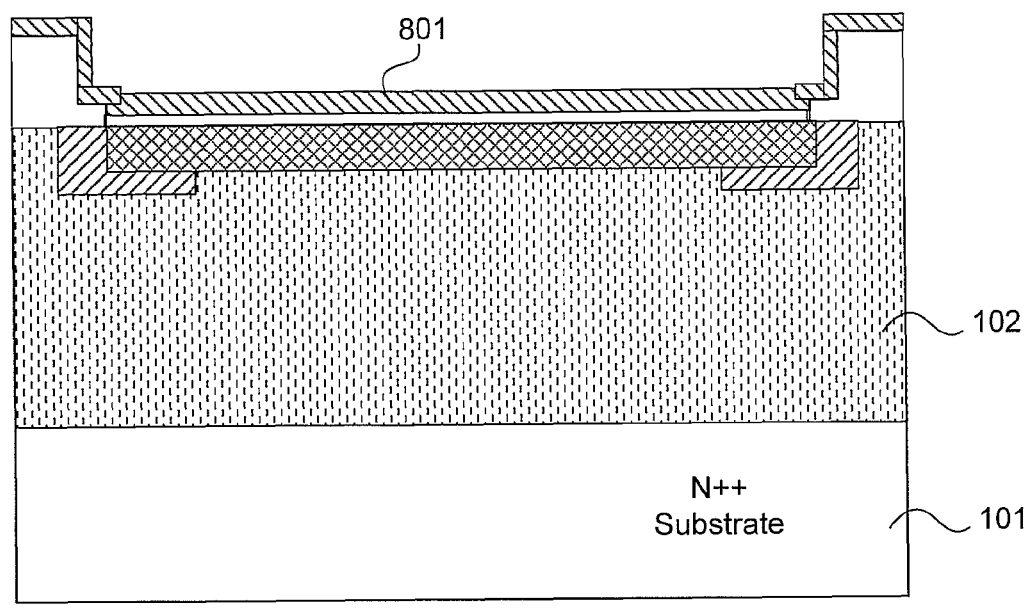
FIG. 8 illustrates a sectional view of a portion of a semiconductor wafer following a ninth step according to one embodiment of the present invention.

Step 9: (Referring to FIG. 8) Depositing silicon nitride 801 to a thickness of approximately 1000 Angstroms, or approximately between 40 Angstroms and 1500 Angstroms.

Figure 9:
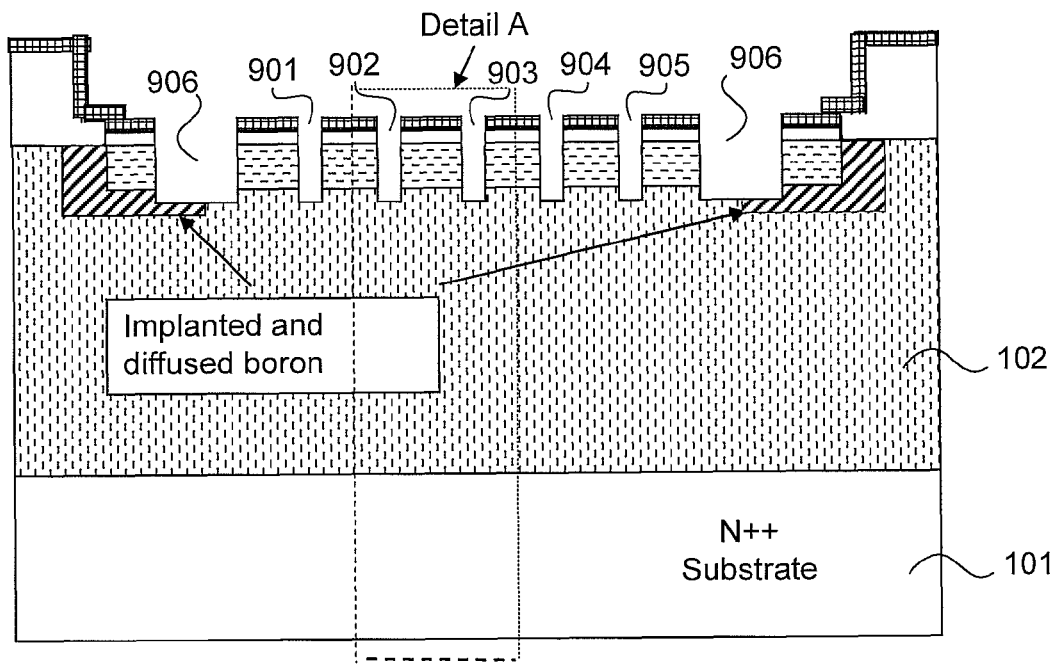
FIG. 9 illustrates a sectional view of a portion of a semiconductor wafer following a tenth step according to one embodiment of the present invention.
Figure 10:
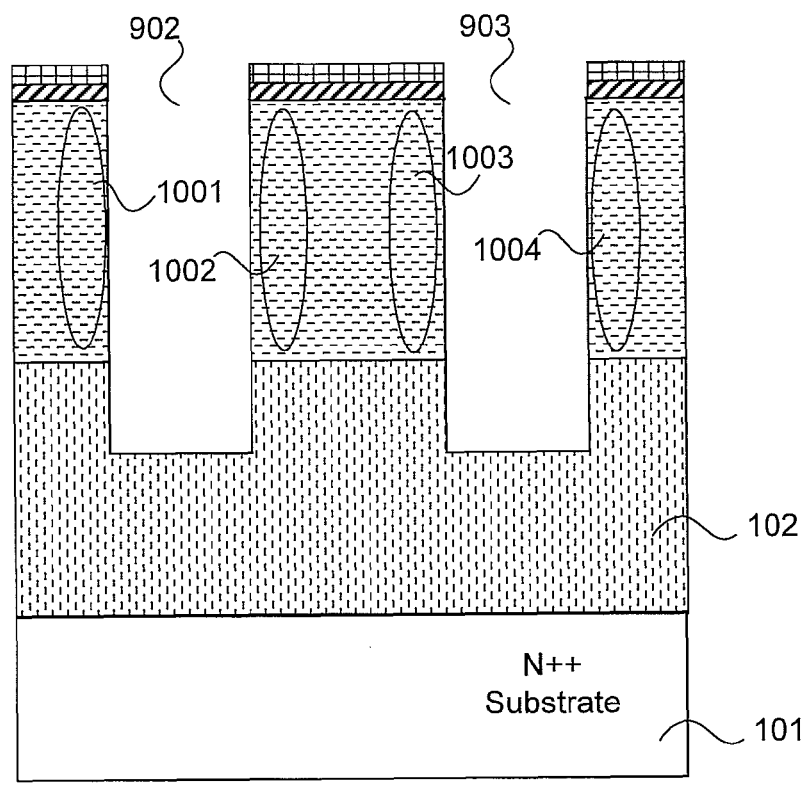
FIG. 10 illustrates a detail "A" of the sectional view of a portion of a semiconductor wafer illustrated in FIG. 9.
Figure 11:
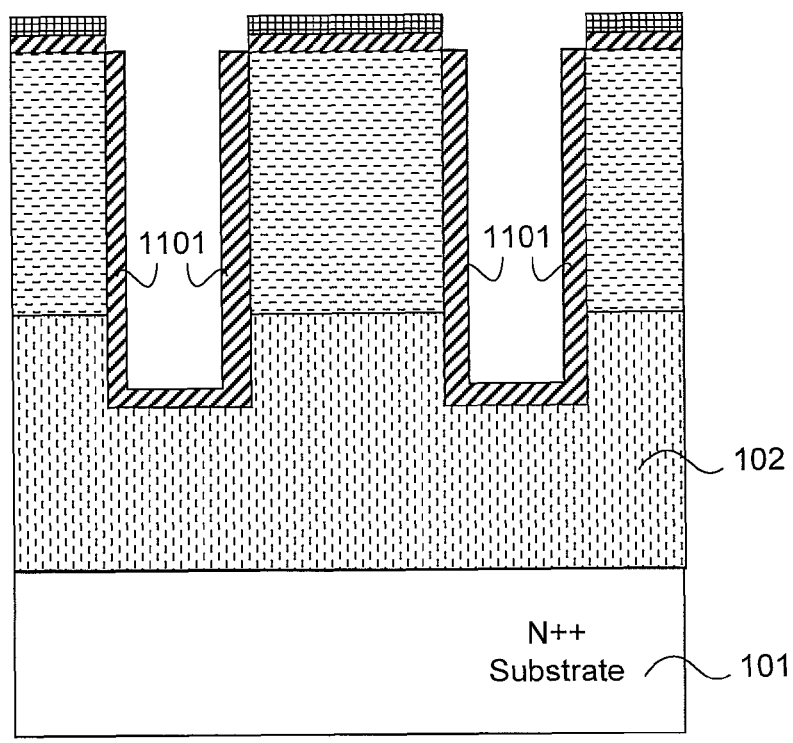
FIG. 11 illustrates the detail "A" of a sectional view of a portion of a semiconductor wafer following an eleventh step according to one embodiment of the present invention.

Step 10: (Referring to FIG. 9) Performing a third photolithography step to define relatively narrow trenches 901-905 and subsequently etching a shallow trench 906 to a depth of approximately 0.8 μm, or approximately between 0.3 μm and 2.0 μm. FIG. 10 shows a close up (detail A) of central portion of an active area of the future device. The trenches 901-906 create P-body regions (e.g. P-body region 1001-1004) which are adjacent to at least one trench wall.

Step 11: (Referring to FIG. 1) Growing oxide 1101 on the walls of the trenches to remove damaged silicon.

Figure 12:
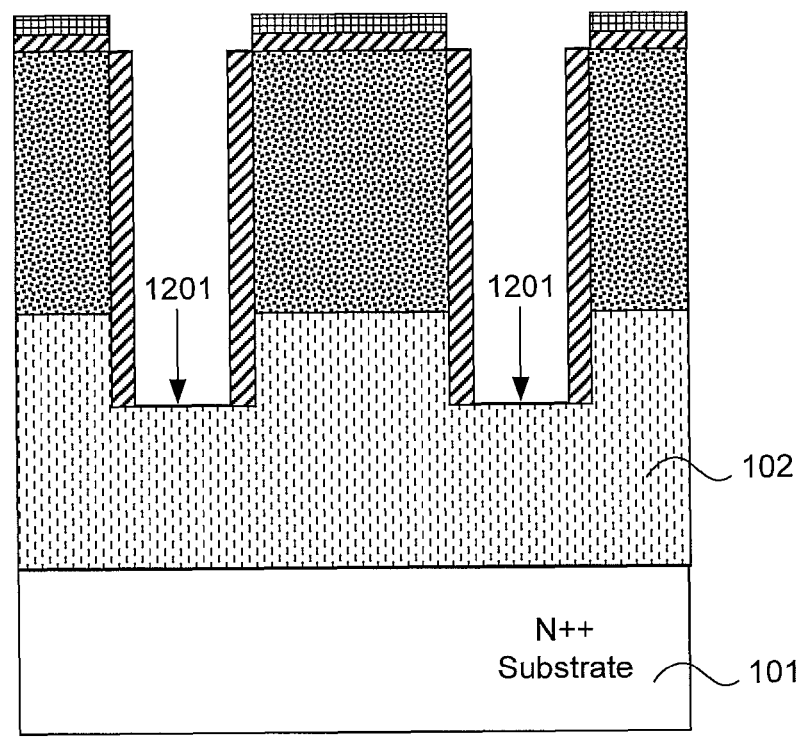
FIG. 12 illustrates the detail "A" of a sectional view of a portion of a semiconductor wafer following a twelfth step according to one embodiment of the present invention.

Step 12: (Referring to FIG. 12), etching the oxide 1101 using reactive ion etching. Silicon nitride is used as a mask during this anisotropic oxide etch, which leaves a bottom of the trenches 1201 free of silicon dioxide but retains oxide 1101 on the walls of the trenches.

Figure 13:
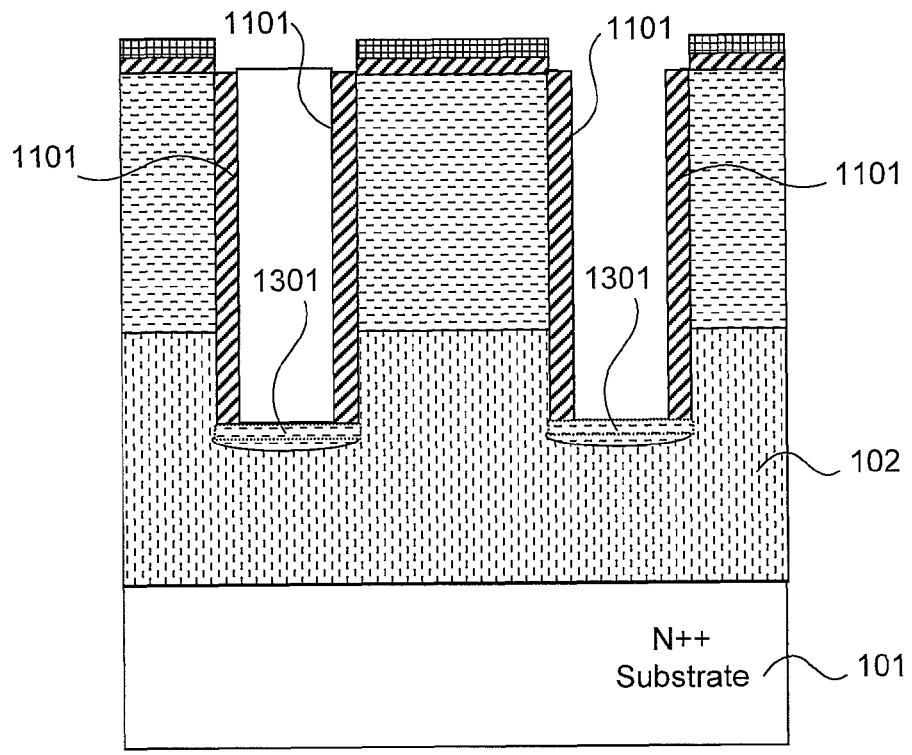
FIG. 13 illustrates the detail "A" of a sectional view of a portion of a semiconductor wafer following a thirteenth step according to one embodiment of the present invention.

Step 13: (Referring to FIG. 13) Implanting low energy and low dose boron or $BF_2$ (1301) for proper termination of the electric field at the bottoms of the trenches. The tilt angle of the implant beam may be approximately 0 degrees. This 0 degrees would make the implant beam perpendicular to the surface of the wafer.

Step 14: Activating the boron implanted (1301) in Step 14 using Rapid thermal Annealing (RTA) at approximately 1000 degrees C. for approximately between 15 seconds and 60 seconds.

Figure 14:
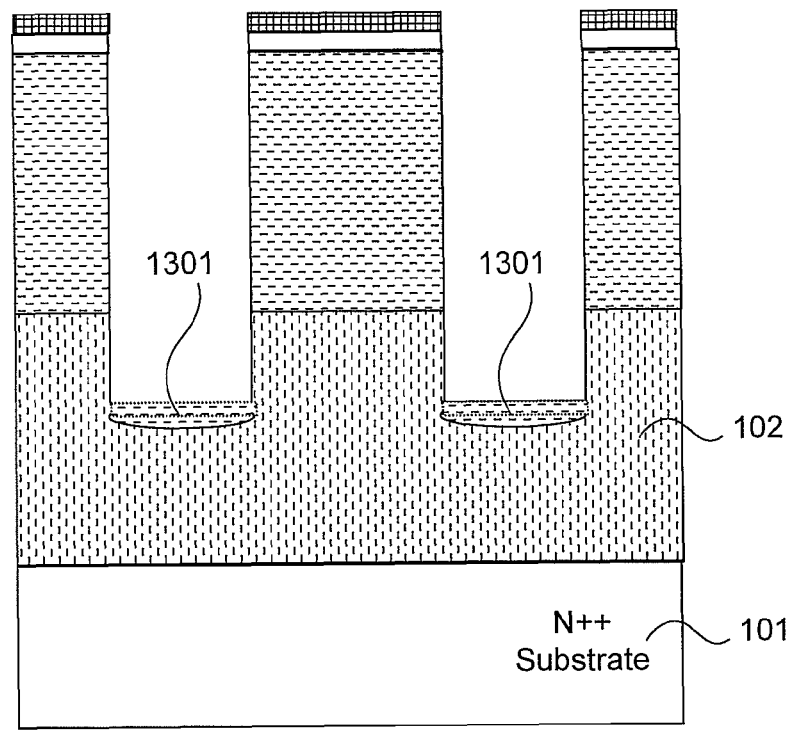
FIG. 14 illustrates the detail "A" of a sectional view of a portion of a semiconductor wafer following the removal of the oxide according to one embodiment of the present invention.
Figure 15:
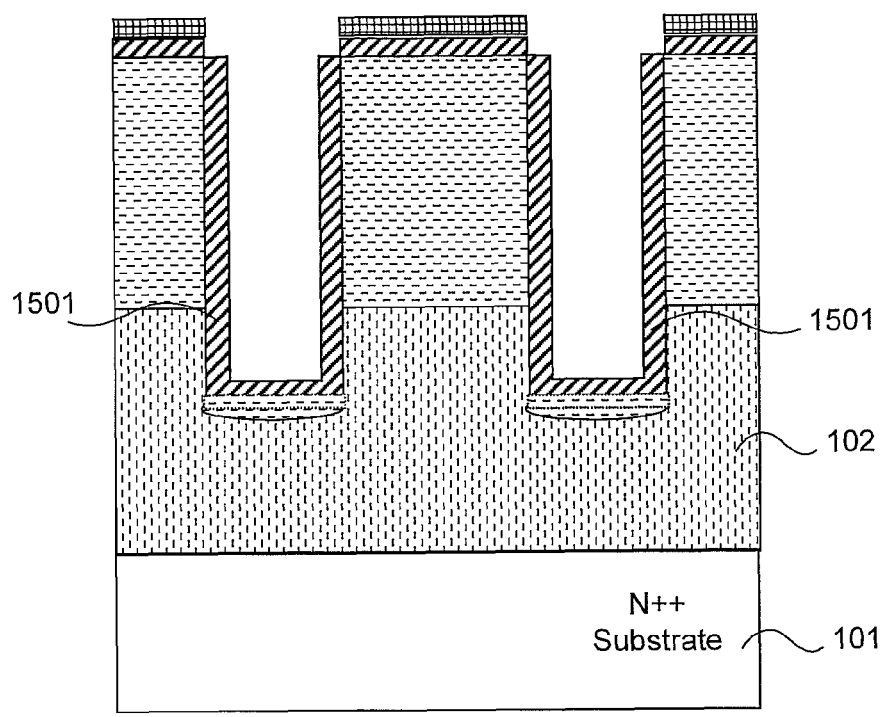
FIG. 15 illustrates the detail "A" of a sectional view of a portion of a semiconductor wafer following a fifteenth step according to one embodiment of the present invention.

Step 15: (Referring to FIG. 14) Removing oxide 1101. (Referring to FIG. 15) Growing high quality gate oxide 1501 approximately between 20 Angstroms and 200 Angstroms thick, or, alternatively, depositing a different suitable dielectric.

Figure 16:
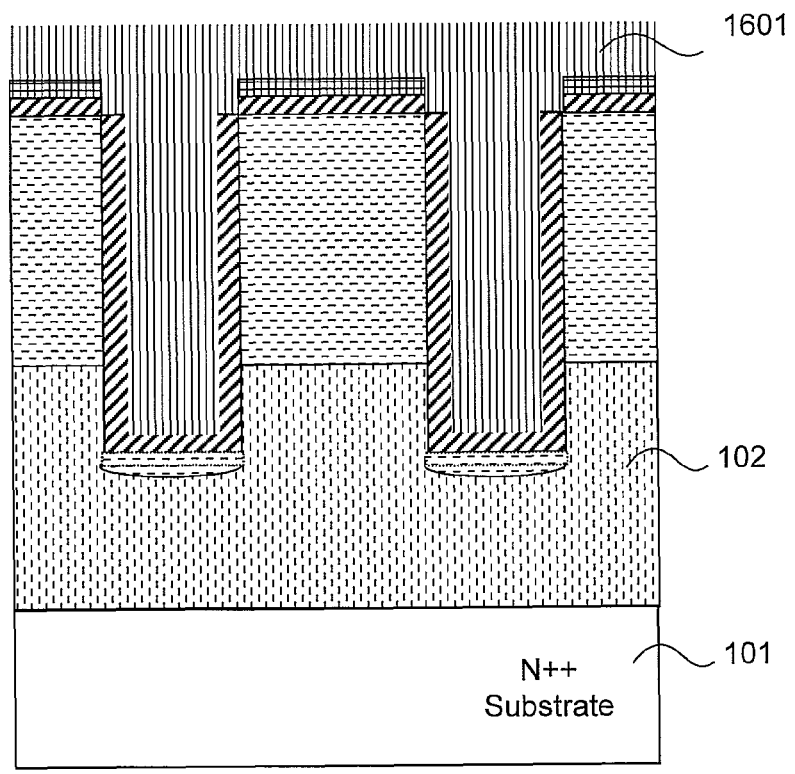
FIG. 16 illustrates the detail "A" of a sectional view of a portion of a semiconductor wafer following a sixteenth step according to one embodiment of the present invention.

Step 16: (Referring to FIG. 16) Depositing polysilicon 1601 heavily doped with phosphorus using a LPCVD system. The purpose of this step is to fill trenches with doped polysilicon in order to provide gate metal over gate dielectric. FIG. 16 illustrates trenches completely filled with phosphorus doped polysilicon 1601.

Step 17: Planarizing the entire structure by etching back the polysilicon using a Reactive Ion Etching ("RIE") or Chemical Mechanical Planarization ("CMP") process.

Figure 17:
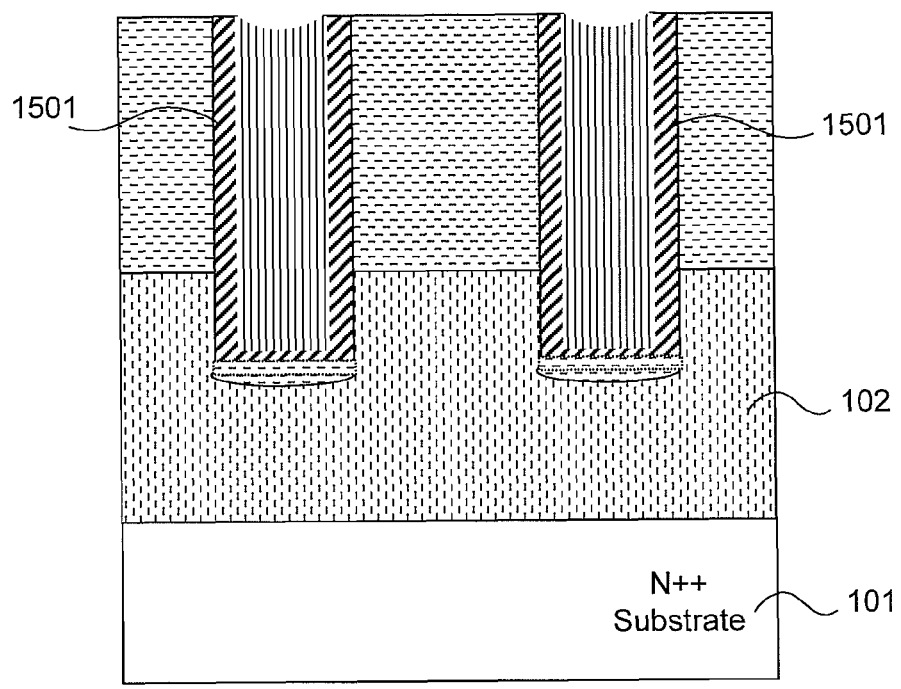
FIG. 17 illustrates the detail "A" of a sectional view of a portion of a semiconductor wafer following an eighteenth step according to one embodiment of the present invention.

Step 18: (Referring to FIG. 17) Etching the remaining silicon nitride 801 and the protective oxide 701.

Figure 18:
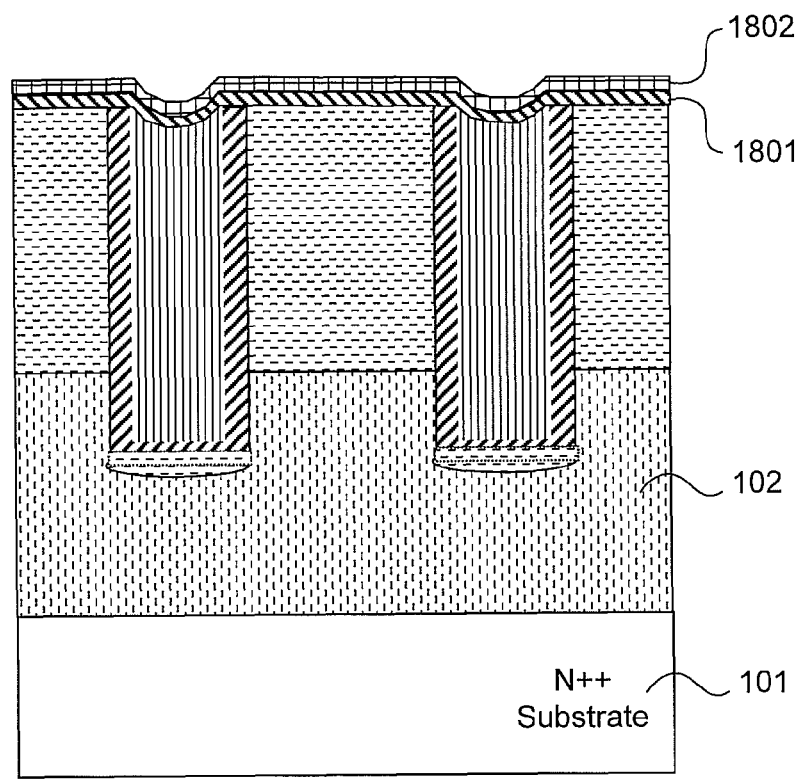
FIG. 18 illustrates the detail "A" of a sectional view of a portion of a semiconductor wafer following a nineteenth step according to one embodiment of the present invention.

Step 19: (Referring to FIG. 18), depositing Ti/TiN (i.e. titanium 1801 and titanium nitride 1802).

Figure 19:
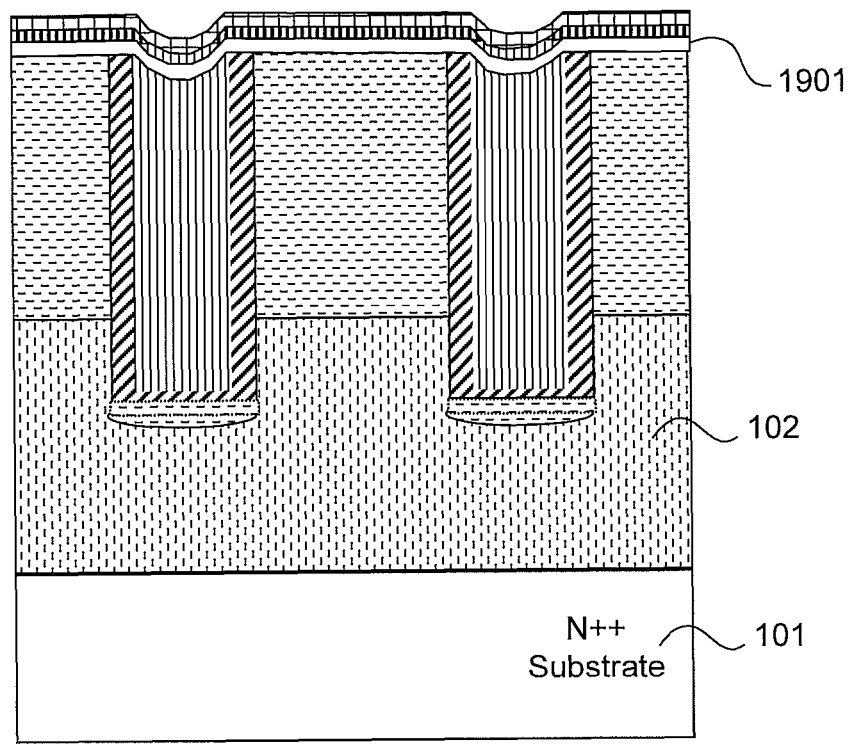
FIG. 19 illustrates the detail "A" of a sectional view of a portion of a semiconductor wafer following a twentieth step according to one embodiment of the present invention.

Step 20: (Referring to FIG. 19) annealing the wafer to create a layer of $TiSi_2$ (i.e. titanium silicide) at the interface of the p-type silicon and titanium layers. The temperature may be high enough to activate the boron but not high enough to diffuse the boron into the silicon. This may be referred to as "snow plowing" in which the majority of boron atoms are pushed to the interface and are segregated from the silicon due to the lack of diffusion caused by the lower temperature. This may result in a thin δp++ layer 1901.

The thin δp++ layer 1901 may improve the electrical characteristic of this diode. For example, the high concentration and width of the thin δp++ layer 1901 may allow for a lower forward bias voltage. Additionally, the high concentration at the thin δp++ layer 1901 may contribute to better blocking (i.e. lower leakage) in the reverse bias condition.

The annealing may be performed using RTA with peak temperature 710° C. and annealing time 15 sec to 75 sec. This annealing condition used during $TiSi_2$ formation may contribute to effective segregation of boron within $TiSi_2$ interface. The temperature is high enough for effective activation of boron so that the δp++ layer 1901 may be formed. The temperature is low enough such that the boron remains segregated at the silicide/semiconductor interface. The redistribution of boron beyond several atomic layers may be prevented by the lack of diffusion of boron into the silicon. The temperature may not be sufficient to allow the boron to diffuse into the silicon to any significant degree.

Since the boron does not diffuse appreciably into the silicon the lightly doped P-body layer 701 may be inverted more easily (i.e. with less of a bias voltage). Since the δp++ layer may not have a width beyond several atomic layers, the doping concentration of the layer does not have a significant length parallel along the dielectric and conductive layers. Therefore, the δp++ layer 1901 may not significantly inhibit the inversion of a P-body region when a very low positive forward bias is provided to a gate (i.e. created with gate oxide 1501 and polysilicon 1601 in steps described above) which is adjacent to the P-body region.

Figure 20:
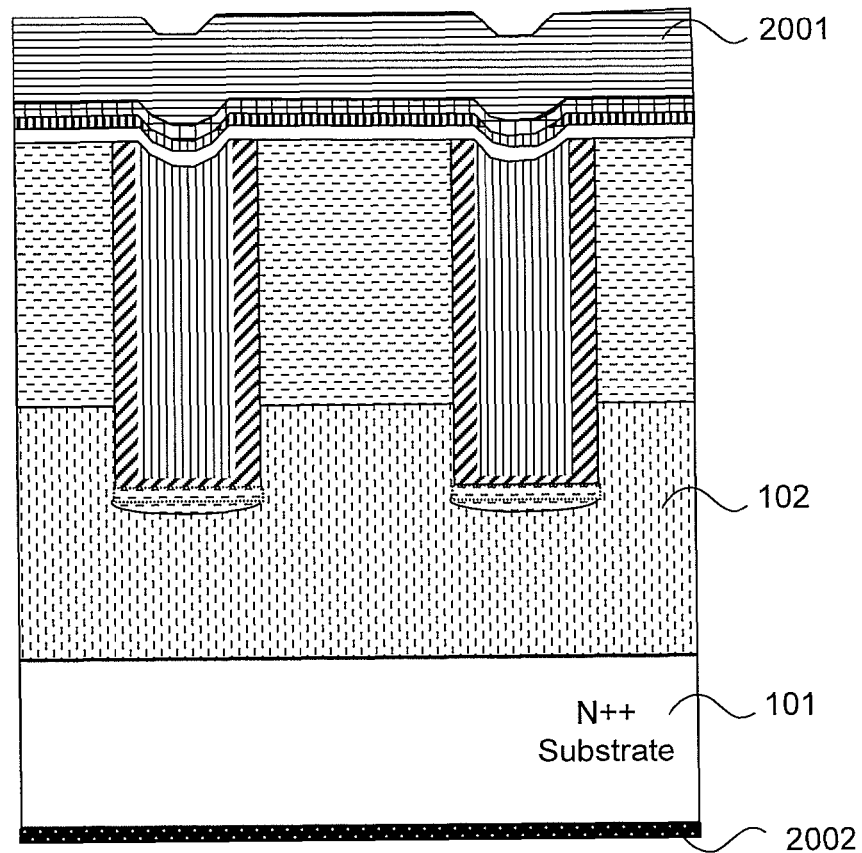
FIG. 20 illustrates the detail "A" of a sectional view of a portion of a semiconductor wafer following a twenty first step according to one embodiment of the present invention.

Step 21: (Referring to FIG. 20) Deposition of aluminum 2001 on the top of TiN. Aluminum is often deposited as a top metal for its low bulk resistance and convenient assembly process employing wire bonding. Cathode back metal 2002 is also deposited on the back side of the wafer very often after significant portion of an original silicon substrate is removed. Typical back side metallization system can be used, such as Ti/Ni/Ag. FIG. 20 illustrates the detail "A" of the power rectifier device of one embodiment of the invention.

Figure 21:
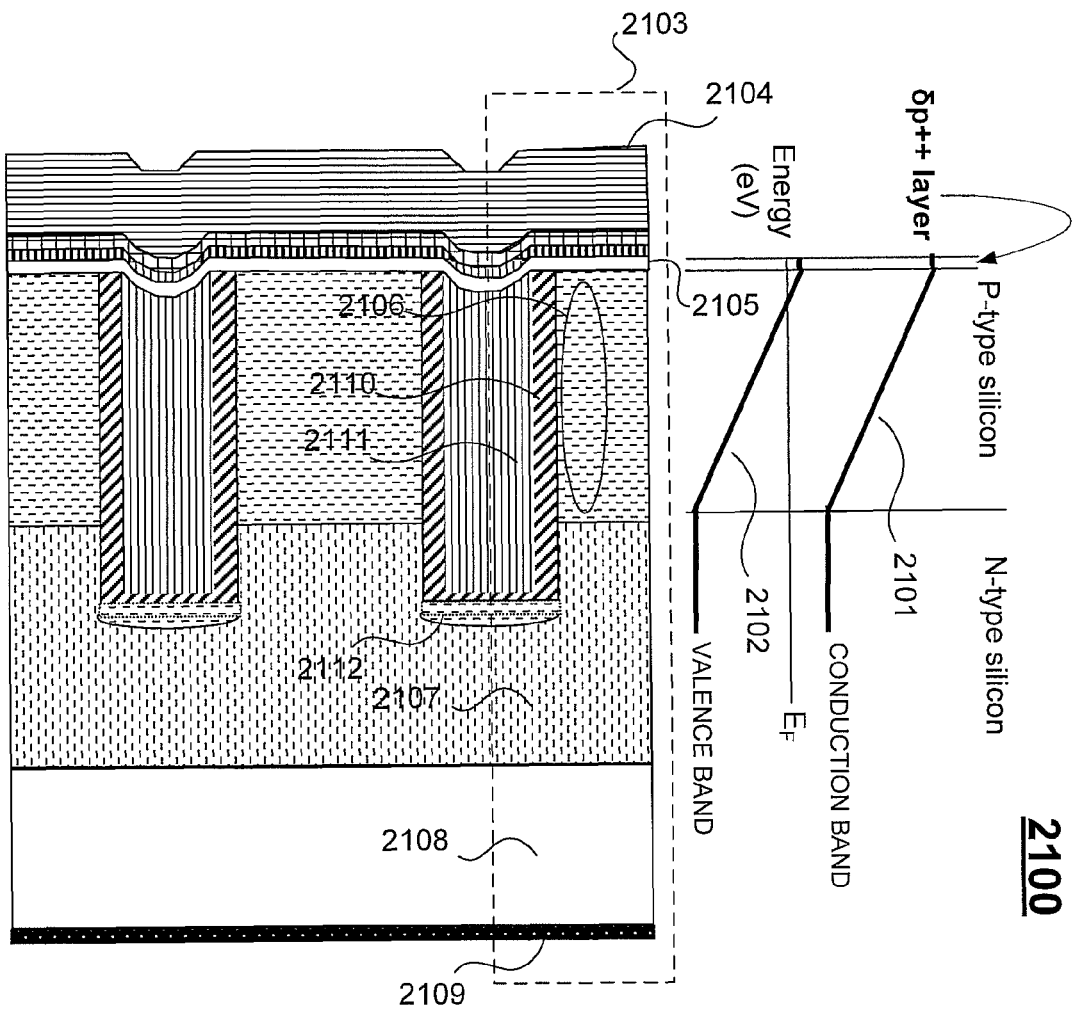
FIG. 21 illustrates the detail "A" of FIG. 20 and a graph of the energy levels of the conduction band and the valence band of a semiconductor rectifier device in equilibrium according to one embodiment of the present invention.

FIG. 21 illustrates the detail "A" of FIG. 20 and a graph 2100 of the energy levels of the conduction band 2101 and the valence band 2102 of the semiconductor rectifier device 2103 in equilibrium according to one embodiment of the present invention. The semiconductor rectifier device 2103 includes anode terminal 2104, δp++ layer 2105, P-body region 2106, N-drift region 2107, N++ substrate 2108, cathode terminal 2109, dielectric layer 2110, conductive layer 2111, and P-implanted region 2112.

δp++ layer 2105 is electrically coupled to anode terminal 2104. P-body region 2106 is located adjacent to δp++ layer 2105. N-drift region 2107 is located adjacent to P-body region 2106. N++ substrate 2108 is located adjacent to N-drift region 2107. Cathode terminal 2109 is electrically coupled to N++ substrate 2108. Dielectric layer 2110 is perpendicular to δp++ layer 2105 and adjacent to P-body region 2106. Conductive layer 2111 is adjacent and parallel to dielectric layer 2110. Conductive layer 2111 is electrically coupled to anode terminal 2109.

The graph 2100 of the energy levels show that relative position of the conduction band 2101 to the valence band 2102 when no bias is given to the cathode 2109 and anode 2104 terminals.

Figure 22:
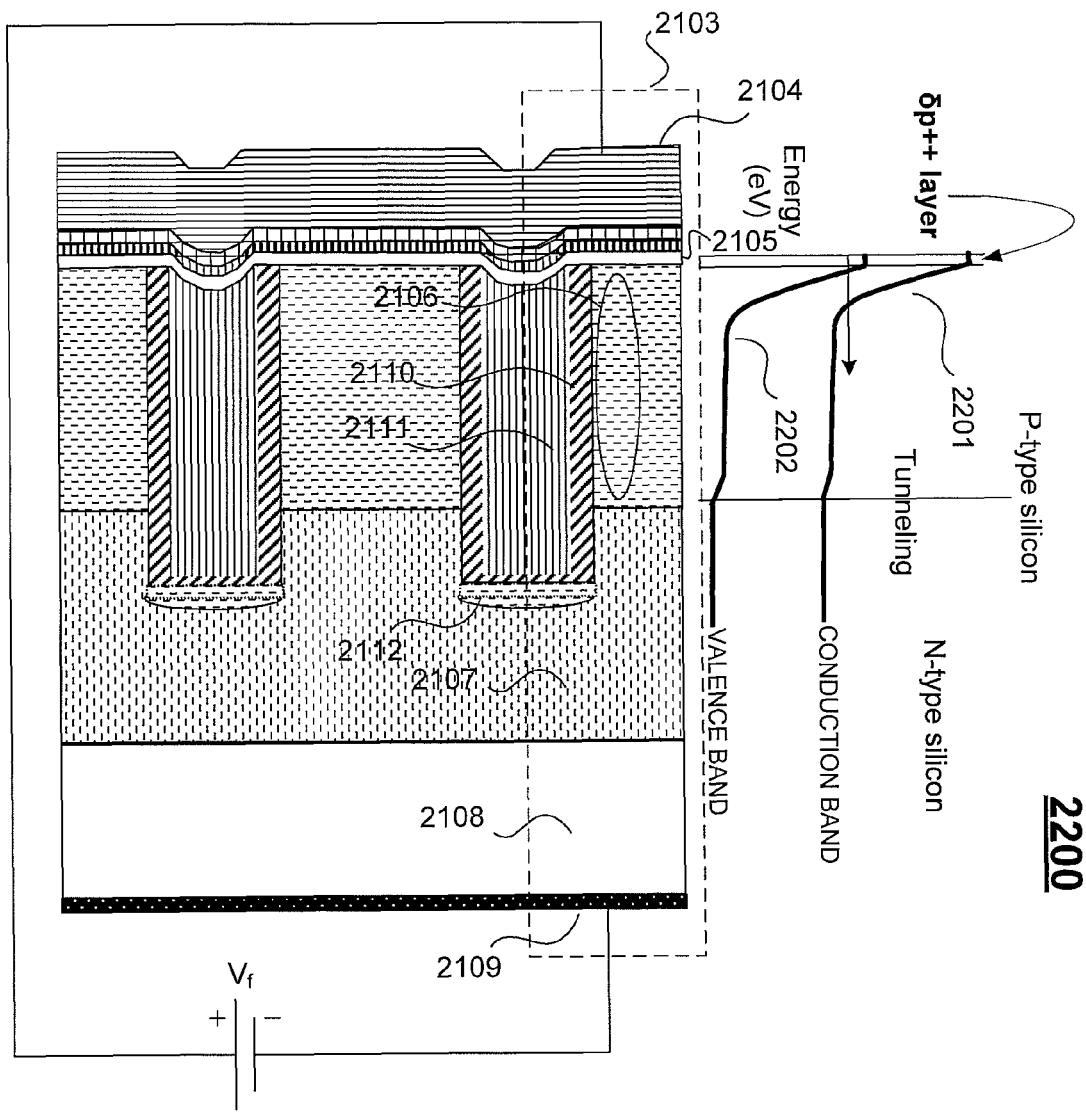
FIG. 22 illustrates the detail "A" of FIG. 20 and a graph of the energy levels of the conduction band and the valence band of a semiconductor rectifier device in a forward bias condition according to one embodiment of the present invention.

FIG. 22 illustrates the detail "A" of FIG. 20 and a graph 2200 of the energy levels of the conduction band 2201 and the valence band 2202 of the semiconductor rectifier device 2103 in a forward bias ($V_f$) condition according to one embodiment of the present invention. If a forward bias $V_f$ of the semiconductor rectifier device is provided across the anode 2104 and cathode 2109 terminals, the P-body region 2106 inverts and becomes an n-type conductive channel. Accordingly the interface of a portion of δp++ layer 2105 and the n-type conductive channel form a tunnel diode. Forward bias $V_f$ of this portion of the rectifier device 2103 provides a reverse bias for the tunnel diode such that a current flows with only a few millivolts of forward bias $V_f$. A low forward bias is obtained when the P-body region 2106 has a low doping concentration such that the P-body region 2106 may be inverted with the forward bias $V_f$ being near 0 volts. Accordingly, this low voltage drop (i.e. $V_f$) reduces power dissipation and improves the efficiency of the rectifier.

In one embodiment, δp++ layer 2105 has a width of several atomic layers or less such that the doping concentration of the layer does not have a significant width. This width is in parallel along the dielectric 2110 and conductive layers 2111 and is preferably be too small to affect the n-channel produced by the inversion of the P-body region 2106. Therefore, δp++ layer 2105 may not significantly inhibit the inversion of the P-body region 2106 when the forward bias $V_f$ is provided.

Graph 2200 shows how the conduction band 2201 and the valence band 2202 are skewed by the biasing and allow for tunneling to occur.

Figure 23:
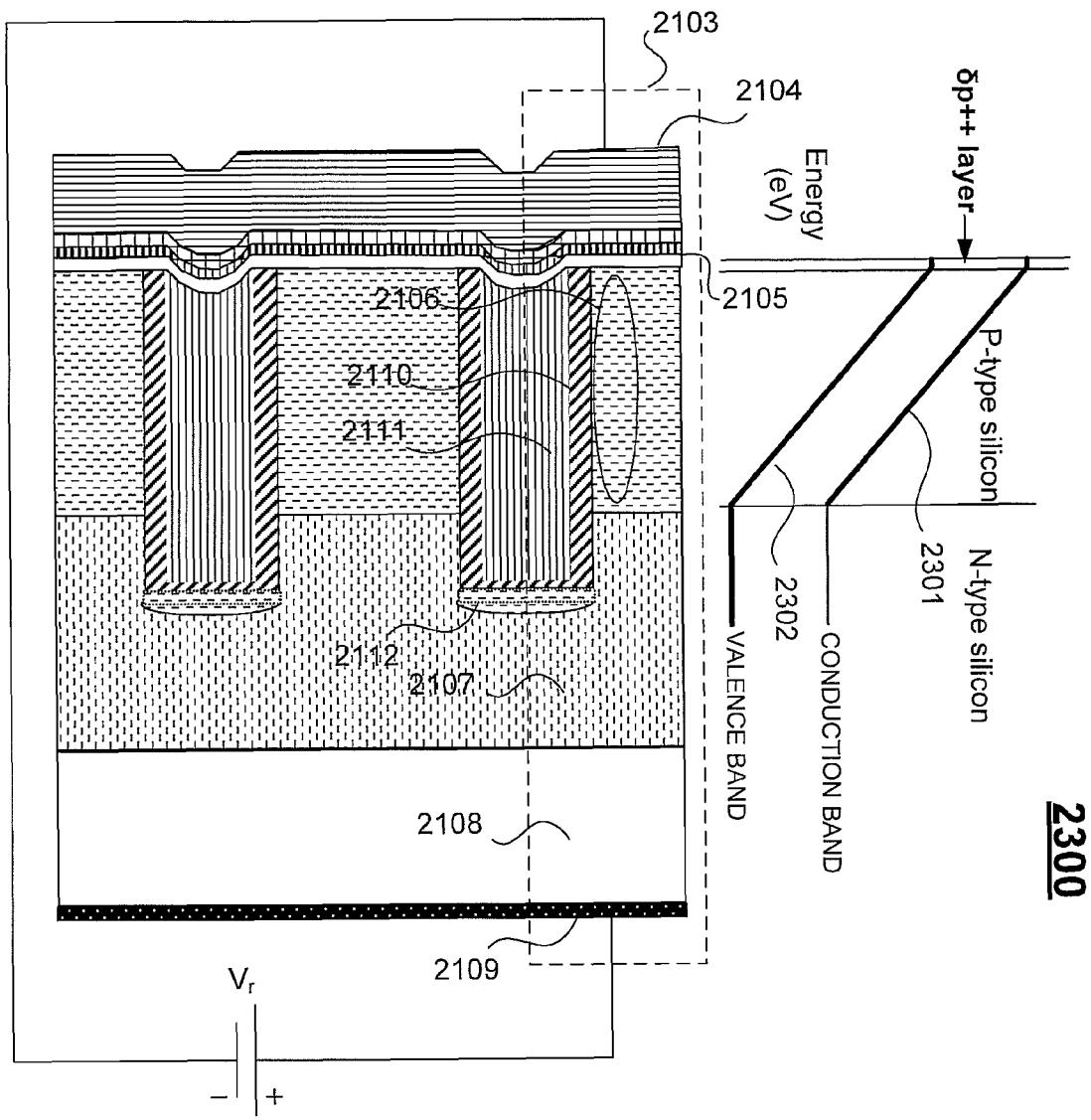
FIG. 23 illustrates the detail "A" of FIG. 20 and a graph of the energy levels of the conduction band and the valence band of a semiconductor rectifier device in a reverse bias condition according to one embodiment of the present invention.

FIG. 23 illustrates the detail "A" of FIG. 20 and a graph 2300 of the energy levels of the conduction band 2301 and the valence band 2302 of the semiconductor rectifier device 2103 in a reverse bias condition (Vr) according to one embodiment of the present invention. If a reverse bias Vr of the semiconductor rectifier device 2103 is provided to the anode 2104 and cathode 2105 terminals, P-body 2106, N-drift region 2107, and N++ substrate 2108 form a PIN diode such that a reverse leakage current is reduced.

Graph 2300 illustrates how the conduction band 2201 and the valence band 2202 are changed by the biasing and restrict the flow of current.

Figure 24:
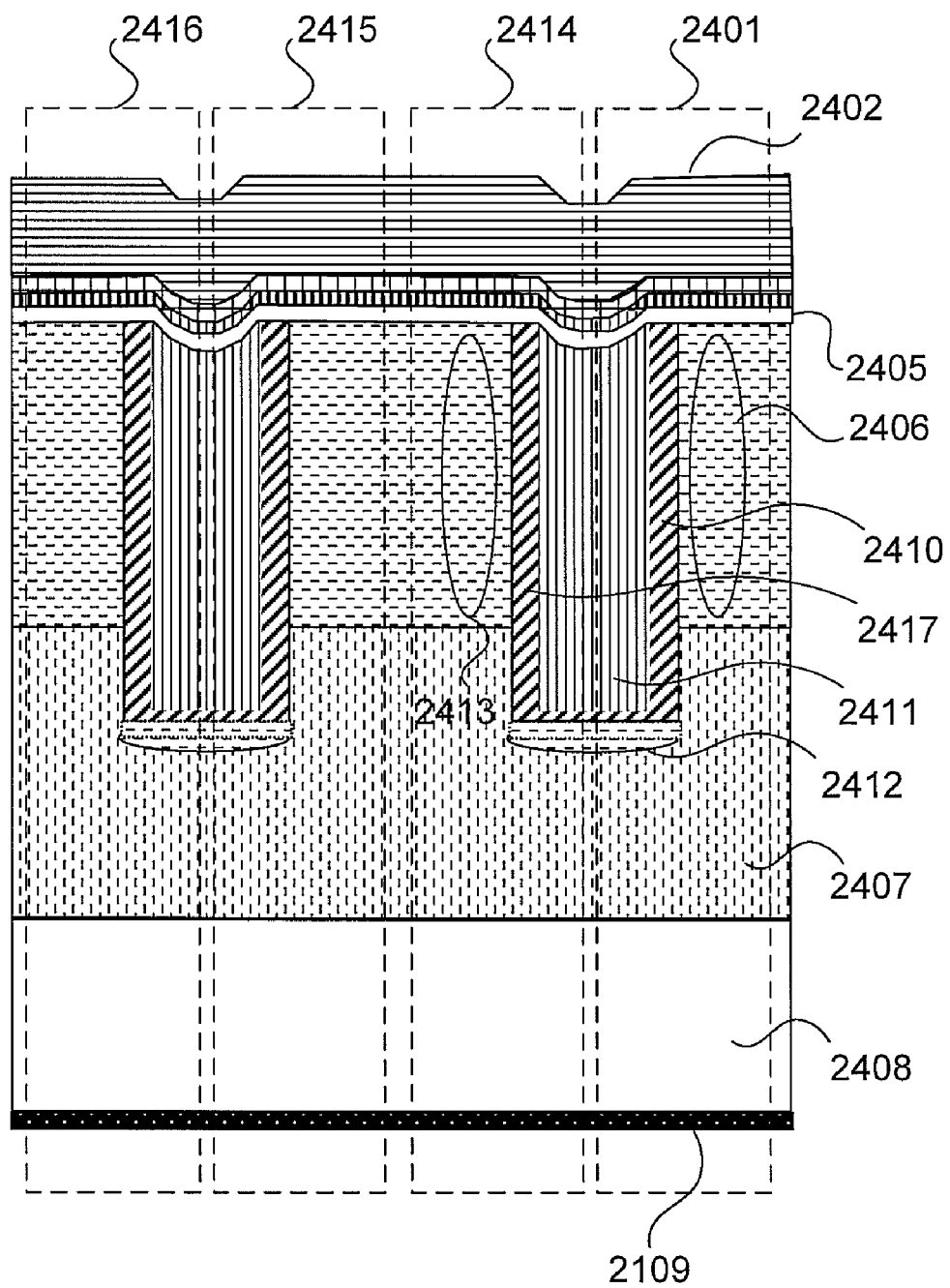
FIG. 24 illustrates a semiconductor rectifier device comprised of a plurality of semiconductor rectifier devices in parallel according to another embodiment of the present invention.

FIG. 24 illustrates a semiconductor rectifier device 2400 comprised of a plurality of semiconductor rectifier devices (e.g. 2401, 2414-2416) in parallel according to another embodiment of the present invention. FIG. 24 includes a second semiconductor rectifier device 2414. The second semiconductor rectifier device 2414 comprises a second P-body region 2413 adjacent to δp++ layer 2405. The dielectric layer and the conductive layer 2411 are formed within the trench. A first side 2410 of the dielectric layer is adjacent to the P-body region 2406 and a second side 2417 of the dielectric layer is adjacent to the second P-body region 2413. The dielectric layer forms a first layer within the trench, and the conductive layer 2307 fills in a remaining volume of the trench. The trench may protrude within the N-drift region 2407. If a forward bias is provided to the anode and cathode terminals, the second P-body region 2413 inverts and becomes a second n-type conductive channel. Accordingly an interface of a second portion of δp++ layer 2405 and the corresponding n-type conductive channel form a second tunnel diode.

When reverse biased, semiconductor rectifier device 2401 and the second semiconductor rectifier device 2414 form PIN diodes in parallel. P-body 2106 and 2413, N-drift region 2407, and the N++ substrate 2408 form the PIN diodes arranged in parallel such that a reverse leakage current is reduced and the current capability of the semiconductor rectifier device is improved.

Semiconductor rectifier devices 2415 and 2416 operate in a similar manner to semiconductor rectifier devices 2401 and 2414. Semiconductor rectifier device 2400 is comprised of a plurality of semiconductor rectifier devices in parallel (e.g. 2401, 2414-2416). When forward biased, semiconductor rectifier device 2400 conducts current as a plurality of reverse biased tunneling diodes which require near 0 V biasing. In the reverse bias condition, semiconductor device 2400 restricts current as a plurality of reverse biased PIN diodes in parallel.

Figure 25:
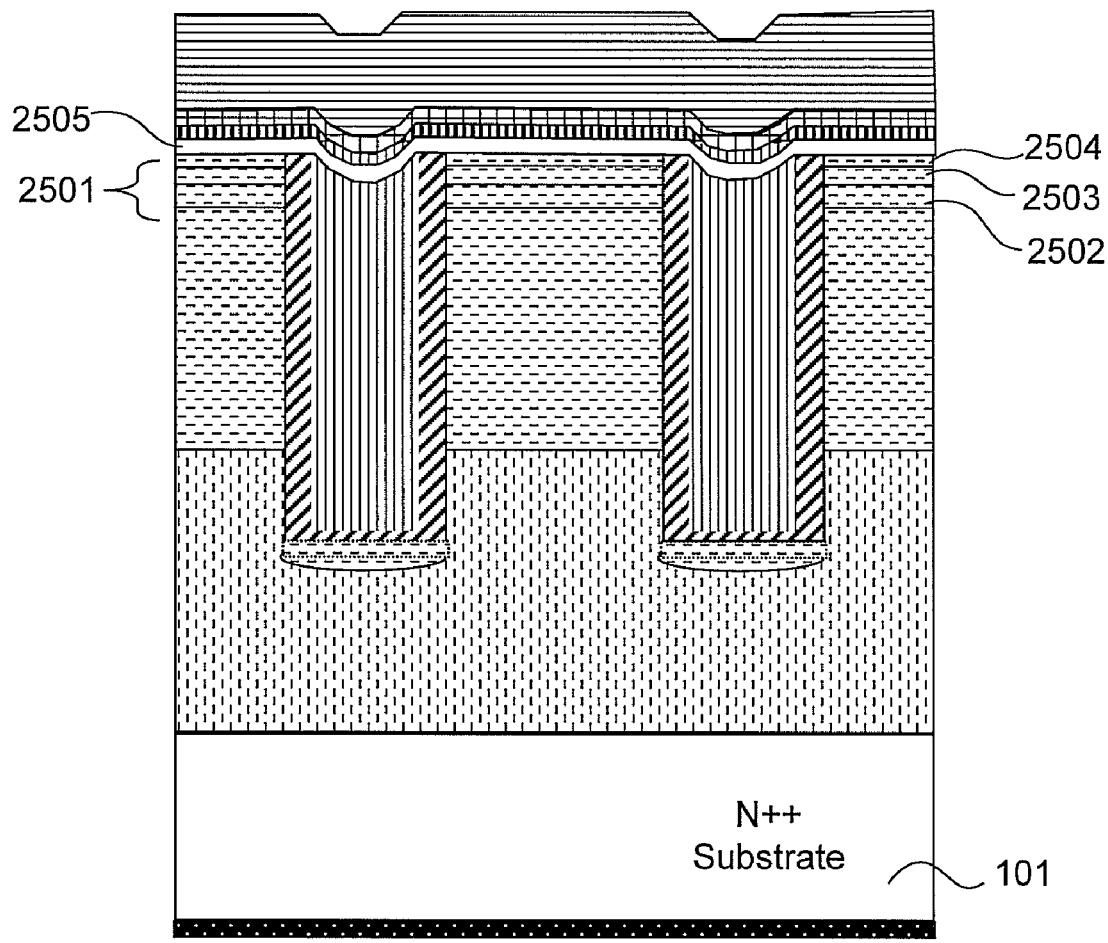
FIG. 25 illustrates an embodiment of the invention incorporating a heterojunction.

The above-described device can be further improved by incorporating a hetero-junction (see FIG. 25). More specifically, a top portion 2501 of the silicon epitaxial can be modified by depositing SiGe in layers 2502-2504 close to the δp++ layer 2505. The SiGe layers 2502-2504 may have various thicknesses, Germanium content, and location in the vertical structure. The layers 2502-2504 may be 0.1 μm-0.2 μm.

The SiGe layers 2502-2504 may better align the conduction band and valence band so that the tunneling is improved. Without the SiGe layers 2502-2504, the conduction band and the valence band may be skewed out of alignment as the forward bias increases. The SiGe layers 2502-2504 may improve the alignment of the conduction band and the valence band and improve the current flow.

In an alternative method of creating a SiGe layer within the n-type silicon epitaxial layer, high dose Germanium is implanted into the traditional n-type epitaxial layer.

The above description illustrates various embodiments of the present invention along with examples of how aspects of the present invention may be implemented. The above examples and embodiments are not the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims. For example, the conduction types of the various regions can be reversed (from N to P and P to N). Also, typically many diodes as described above may be formed on substrate 101 simultaneously. Such devices may have more or fewer trenches than are shown in the drawings. Also, the trench walls can be sloped instead of vertical.

The above-incorporated '261 application illustrates other device geometries that can be used to practice the invention.

What is claimed is:

1. A method of manufacturing a semiconductor rectifier device, the method comprising:
   depositing an N-drift region on an N++ substrate;
   implanting boron into the N-drift region to create a P-body layer;
   forming a plurality of trenches within the P-body layer, the trenches forming a plurality of P-body regions;
   forming a dielectric layer within each trench of the plurality of trenches;
   depositing conductive gate material to fill a remaining volume within each trench of the plurality of trenches;
   etching back the conductive gate material to form a planar surface above the plurality of P-body regions;
   depositing a layer of titanium and a layer of titanium nitride on the planar surface;
   annealing to create a layer of titanium silicide at an interface between the plurality of P-body regions and the titanium layer, and in accordance therewith, forming a δp++ layer.

2. The method of claim 1 wherein the annealing has a peak temperature of 710 degrees Celsius and an annealing time from 15 seconds to 75 seconds.

3. The method of claim 1 wherein the annealing has an annealing time from 15 seconds to 75 seconds.

4. The method of claim 1 wherein the forming the dielectric layer includes growing a gate oxide between 20 Angstroms and 200 Angstroms.

5. The method of claim 1 wherein the conductive gate material is a polysilicon doped with phosphorous using a LPCVD system.

6. The method of claim 1 wherein the forming the plurality of trenches includes:

performing lithography to define the trenches; and
etching the trenches to a depth between 0.3 µm to 2.0 µm.

7. The method of claim 1 wherein depositing the N-drift region on the N++ substrate includes epitaxially depositing to create the N-drift region and
wherein the N++ substrate is an arsenic-doped or phosphorus-doped single crystal silicon substrate having a resistivity lower than 0.005 Ωcm.

8. The method of claim 1 wherein the N-drift region has a resistivity of approximately 0.4 Ωcm and a thickness of approximately 4 µm.

9. The method of claim 1 further comprising
growing a oxide within the trench prior to forming the dielectric layer;
etching the oxide which leaves a bottom of the trenches of the plurality of trenches free of silicon dioxide;
implanting boron at the bottom of the trenches of the plurality of trenches;
activating the boron at the bottom of the trenches of the plurality of trenches; and
removing the oxide.

10. The method of claim 9 wherein the activating the boron at the bottom of the trenches of the plurality of trenches includes using rapid thermal annealing at approximately 1000 degrees Celsius for a time between 15 to 60 seconds.

11. A semiconductor rectifier device comprising:
an anode terminal;
a δp++ layer electrically coupled to the anode terminal;
a P-body region located adjacent to the δp++ layer;
an N-drift region located adjacent to the P-body region;
an N++ substrate located adjacent to the N-drift region;
a cathode terminal electrically coupled to the N++ substrate;
a dielectric layer perpendicular to the δp++ layer and adjacent to the P-body region; and
a conductive layer adjacent and parallel to the dielectric layer, the conductive layer electrically coupled to the anode terminal,
wherein if a forward bias of the semiconductor rectifier device is provided across the anode and cathode terminals, the P-body region inverts and becomes an n-type conductive channel, and in accordance therewith, an interface of a portion of the δp++ layer and the n-type conductive channel form a tunnel diode.

12. The semiconductor rectifier device of claim 11 wherein the P-body region has a low doping concentration such that the P-body region may be inverted with the forward bias being near 0 volts, and in accordance therewith, improve the efficiency of the rectifier.

13. The semiconductor rectifier device of claim 11 wherein the δp++ layer does not have a width beyond several atomic layers such that the doping concentration of the layer does not have a significant length parallel along the dielectric and conductive layers, and in accordance therewith, the δp++ layer does not significantly inhibit the inversion of the P-body region when the forward bias is provided.

14. The semiconductor rectifier device of claim 11 wherein if a reverse bias of the semiconductor rectifier device is provided to the anode and cathode terminals, the P-body, N-drift region, and the N++ substrate form a PIN diode such that a reverse leakage current is reduced.

15. The semiconductor rectifier device of claim 11 further comprising a second P-body region adjacent to the δp++ layer,
wherein the dielectric layer and the conductive layer are formed within a trench and the P-body region is located adjacent to a first side of the trench and the second P-body region is located on a second side of the trench,
wherein the dielectric layer forms a first layer within the trench and the conductive layer fills in a remaining volume of the trench,
wherein the trench protrudes within the N-drift region,
wherein if the forward bias is provided to the anode and cathode terminals, the second P-body region inverts and becomes a second n-type conductive channel, and in accordance therewith, an interface of a second portion of the δp++ layer and the n-type conductive channel form a second tunnel diode.

16. The semiconductor rectifier device of claim 15 further comprising a P-implanted region at a bottom of the trench,
wherein the P-implanted region lies between the dielectric layer and the N-drift area, the conductive layer having corners at the bottom of the trench,
wherein the P-conductive area reduces high electric field intensity at the corners of the trench.

17. A semiconductor rectifier device comprising:
an anode terminal;
a δp++ layer electrically coupled to the anode terminal;
a plurality of P-body regions each located adjacent to a portion of the δp++ layer;
an N-drift region located adjacent to the plurality of P-body regions;
a plurality of trenches having sides adjacent to the P-body regions and having a bottom protruding within the n-drift region, each trench comprising,
a dielectric layer forming a first layer covering the sides and bottom of the trench,
a conductive layer filling a remaining volume within the trench;
an N++ substrate located adjacent to the N-drift region;
a cathode terminal electrically coupled to the N++ substrate;
wherein if a forward bias of the semiconductor rectifier device is provided across the anode and cathode terminals, each side of the P-body region of the plurality of P-body regions inverts and becomes an n-type conductive channel, and in accordance therewith, a plurality of interfaces between a plurality of portions of the δp++ layer and their corresponding n-type conductive channels form a plurality of tunnel diodes.

18. The semiconductor rectifier device of claim 17 wherein the plurality of P-body regions each have a low doping concentration such that each P-body region may be inverted with the forward bias being near 0 volts, and in accordance therewith, improve the efficiency of the rectifier.

19. The semiconductor rectifier device of claim 17 wherein the δp++ layer does not have a width beyond several atomic layers such that the doping concentration of the layer does not have a significant length parallel along the dielectric and conductive layers within the plurality of trenches, and in accordance therewith, the δp++ layer does not significantly inhibit the inversion of the plurality of P-body regions when the forward bias is provided.

20. The semiconductor rectifier device of claim 17 wherein if a reverse bias of the semiconductor rectifier device is provided to the anode and cathode terminals, the plurality of P-body, the N-drift region, and the N++ substrate form a PIN diode such that the reverse leakage current is reduced.

* * * * *